United States Patent [19]

Kawano

[11] Patent Number: 5,574,958

[45] Date of Patent: Nov. 12, 1996

[54] HYDROGEN RADICAL PRODUCING APPARATUS

[75] Inventor: Masaya Kawano, Tokyo, Japan

[73] Assignee: NEC Corporation, Tokyo, Japan

[21] Appl. No.: 428,350

[22] Filed: Apr. 25, 1995

[30] Foreign Application Priority Data

Apr. 26, 1994 [JP] Japan .................................. 6-88581

[51] Int. Cl.$^6$ ........................................ B01J 19/08
[52] U.S. Cl. ................................. 422/186; 422/906
[58] Field of Search ........................ 156/381; 427/569;
118/715, 719, 723 R, 724; 422/186, 906

[56] References Cited

U.S. PATENT DOCUMENTS

| | | | |
|---|---|---|---|
| 3,916,034 | 10/1975 | Tsuchimoto | 427/38 |
| 4,740,263 | 4/1988 | Imai et al. | 156/613 |
| 4,859,490 | 8/1989 | Ikegaya et al. | 427/38 |
| 4,900,628 | 2/1990 | Ikegaya et al. | 428/408 |
| 5,145,712 | 9/1992 | Jesser et al. | 427/38 |
| 5,269,848 | 12/1993 | Nakagawa | 118/723 |
| 5,399,230 | 3/1995 | Takatani et al. | 156/628 |

FOREIGN PATENT DOCUMENTS

| | | |
|---|---|---|
| 61-59821 | 3/1986 | Japan . |
| 1232651 | 9/1989 | Japan . |
| 5890 | 1/1993 | Japan . |

OTHER PUBLICATIONS

"Condensed Chemical Dictionary", G. G. Hawley, 1981, pp. 42–43.

Takeyoshi Sugaya et al., "Low–Temperature Cleaning of GaAs Substrate by Atomic Hydrogen Irradiation", Japanese Journal of Applied Physics, vol. 30, No. #A, Mar. 1991, pp. L402–L404.

Primary Examiner—Charles T. Jordan
Assistant Examiner—Daniel Jenkins
Attorney, Agent, or Firm—Sughrue, Mion, Zinn, Macpeak & Seas

[57] ABSTRACT

An apparatus for producing hydrogen radicals, includes (a) a pipe having a cross-sectional area decreasing toward one end from the other thereof, the pipe being composed of metal having a high melting point, (b) a filament for generating heat by running an electrical current therethrough, the filament being disposed in the pipe free of contact with the pipe, and (c) a hydrogen gas source for supplying hydrogen gas to the pipe through the end of the pipe with the larger cross-sectional area. The pipe is electrically isolated from any peripherals, including the filament. The apparatus provides a high production rate of hydrogen radicals, and also prevents gas leakage therefrom, avoiding contamination.

16 Claims, 6 Drawing Sheets

HYDROGEN RADICAL PRODUCING APPARATUS

BACKGROUND OF THE INVENTION

1. Field of the Invention

The invention relates to an apparatus for producing hydrogen radicals, and also to a cover for use with such an apparatus.

2. Description of the Related Art

Figure 1:
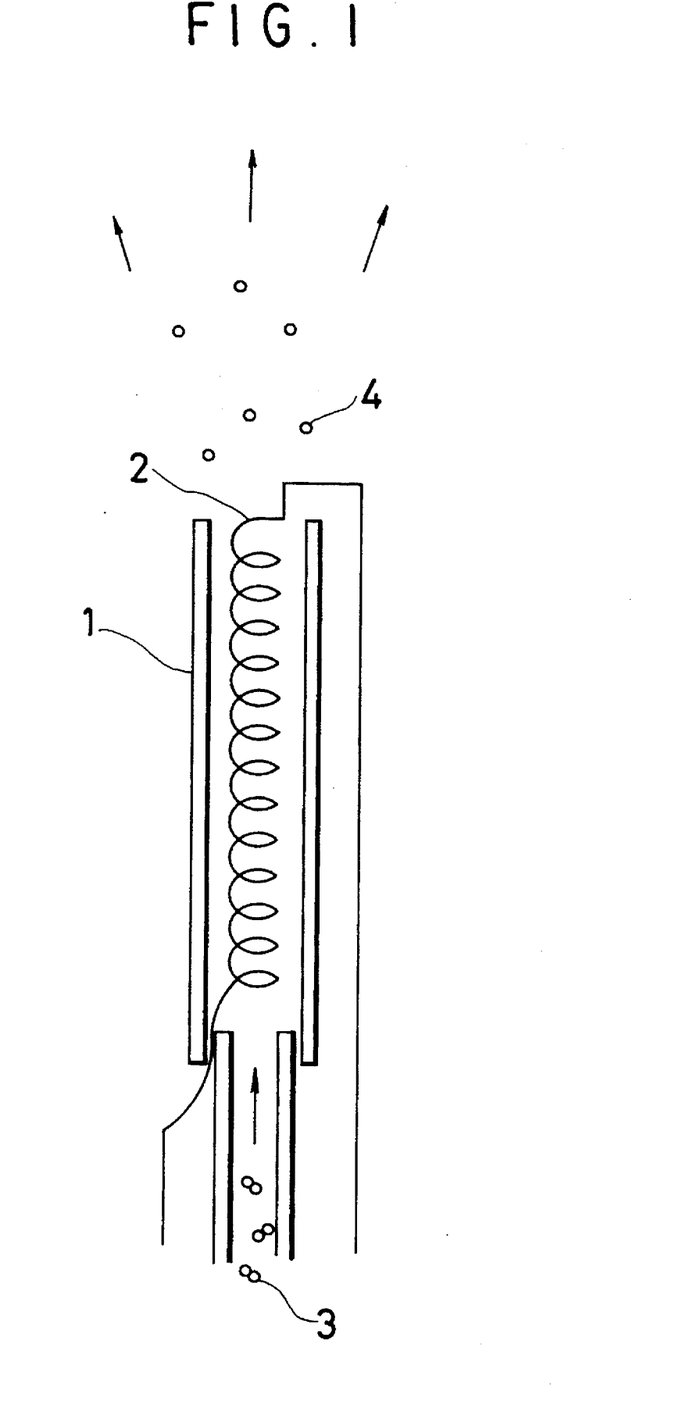
FIG. 1 is a cross-sectional view illustrating a conventional hydrogen radical producing apparatus using a hot filament.

A typical apparatus for producing hydrogen radicals by means of a hot filament is a hydrogen cracking cell (as reported in Japanese Journal of Applied Physics, Vol. 30, No. 3A, March, 1991, page L 402–L 404). FIG. 1 schematically illustrates a structure of the hydrogen cracking cell. The cell comprises a pipe 1 (composed of boron nitride (BN) and having an internal diameter of 4 mm), and a filament 2 (composed of tungsten (W), 100 mm long), disposed in pipe 1. First, an electrical current is run through filament 2 to heat it 2. Then, hydrogen gas 3 is fed through the pipe 1. Hydrogen gas 3 is dissociated into atomic hydrogens, (i.e.;) hydrogen radicals 4).

Japanese Unexamined Patent Public Disclosure No. 5-890 has suggests an apparatus for producing hydrogen radicals in which thermal capillaries are used in place of a hot filament. In this apparatus, hydrogen gas is fed through a plurality of capillaries composed of metal having a high melting point. The apparatus provides is claimed to provide a high production rate of hydrogen radicals.

Japanese Unexamined Patent Public Disclosure No. 61-59821 suggests a radical beam producing apparatus comprising (a) a discharge chamber, in which radicals are produced by means of high frequency discharge, using a magnetic field wherein plasma is gathered around an axis thereof, and (b) a plurality of orifices, for introducing the radicals (produced in the discharge chamber) into a process chamber in the form of beams. It is set forth that the apparatus provides in a layer forming process, a higher etching speed, without damaging a substrate.

Japanese Unexamined Patent Public Disclosure No. 1-232651 also suggests a radical beam producing apparatus. The apparatus comprises (a) a discharging device for receiving energy and for gas-discharging, (b) a plasma chamber for dissociating and exiting the gas discharged from the discharging device to thereby produce radicals, (the plasma chamber having an opening through which the thus produced radicals are drawn out), and (c) a magnet located adjacent to the opening. The Disclosure asserts that the apparatus provides radical beams free of ions and electrons.

The production of hydrogen radicals requires a very high temperature, specifically, in the range of 1500 to 2000 degrees centigrade. When hydrogen radicals are to be used for cleaning a substrate in a semiconductor manufacturing apparatus, there is concern that the substrate may be contaminated by gases leaked out of the apparatus that produces the hydrogen radicals. This concern is particularly significant when II–VI material, which has a high vapor pressure, is to be used in fabricating a semiconductor. Thus, it is absolutely necessary, in the production of hydrogen radicals to use a hot filament which generates a small quantity of heat relative to the filament temperature thereof. However, when a material having a high vapor pressure is used, the substrate might be contaminated by gases leaked due to heat derived from the filament.

A thinner filament generates a smaller quantity of heat relative to the temperature thereof, but provides a smaller cross-sectional area to the hydrogen gas, deteriorating the thereby production rate of hydrogen radicals. Conventionally when a hot filament is used it is in the pipe composed of boron nitride (BN) to avoid the deterioration of a production rate of hydrogen radicals. However, such arrangement is accompanied by gas with leakage from the BN pipe. Since the temperature of the filament ranges from 1500 to 2000 degrees centigrade, there is concern over boron (B) contamination.

This problem can be solved, for instance, by replacing the BN pipe with a pipe composed of a metal which has a high melting point. However, such replacement is accompanied by the problem of electrical insulation. If the pipe composed of metal having a high melting point comes in contact with a filament, there occurs a leakage of current, making it impossible to heat the filament fully up to the desired temperature. In order to avoid such a problem, the pipe diameter needs to be sufficiently large relative to the filament diameter, taking into consideration the successive change of the filament diameter over time. However, such a design is accompanied by the above-mentioned deterioration of the hydrogen radical production rate. This is a vicious cycle.

Figure 2:
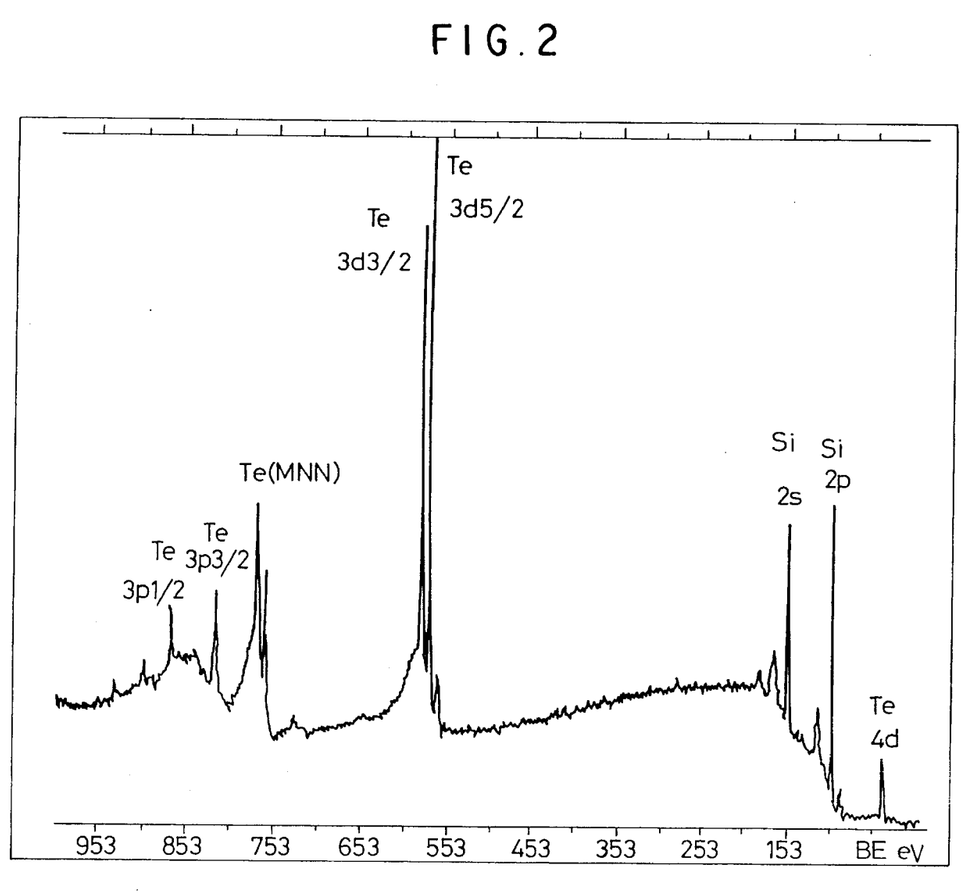
FIG. 2 shows the XPS spectrum of the surface of a silicon substrate in an example where no cover for preventing gas leakage was used.

In addition, since hydrogen radicals are active, hydrogen radicals irradiated to an area other than a substrate react with material stuck to the internal surface of the hydrogen radical producing apparatus, thereby generating hydride and causing contamination. For instance, when hydrogen radicals were irradiated to a silicon substrate, in a semiconductor manufacturing apparatus having an internal surface to which material containing Te is stuck, it was observed by means of X-ray photo-electron spectroscopy (XPS) that a part of a surface of the Si substrate was contaminated with Te (as shown in FIG. 2).

SUMMARY OF THE INVENTION

In view of the above mentioned problems of prior apparatuses, it is an object of the present invention to provide a hydrogen radical producing apparatus which provides a high production rate of hydrogen radicals and solves the contamination problems caused by impurities, and also to provide a cover for use with a hydrogen radical producing apparatus, to avoid the contamination caused by impurities such as leaked gas and hydride.

The invention provides an apparatus for producing hydrogen radicals, including (a) a pipe having a cross-sectional area decreasing toward one end from the other thereof, the pipe being composed of metal having a high melting point, (b) a filament for generating heat by running an electrical current therethrough, the filament being disposed in the pipe in no contact with the pipe, and (c) a hydrogen gas source for supplying hydrogen gas to the pipe through an end of the pipe having a larger cross-sectional area. The pipe is electrically isolated from any peripherals, including the filament.

The invention also provides an apparatus for producing hydrogen radicals, including (a) a pipe having a cross-sectional area decreasing toward one end from the other thereof, the pipe being composed of metal having a high melting point, (b) a filament for generating heat by running an electrical current therethrough, the filament disposed in the pipe but not in contact with the pipe, (c) a hydrogen gas source for supplying hydrogen gas to the pipe through the end of the pipe having a larger cross-sectional area, and (d) a cover for entirely surrounding the apparatus, the cover having an opening through which hydrogen radicals are irradiated, the cover being composed of material which does not produce hydride in reacting with hydrogen radicals. The pipe is electrically isolated from any peripherals, including the filament.

The pipe may be shaped different ways as long as it has a decreasing (or increasing) cross-sectional area from one end toward the other thereof. Thus, the pipe may be shaped in a triangular pyramid, a quadrangular pyramid or any other polygonally angular pyramid. Most preferably, the pipe's shape is conical.

In a preferred embodiment, the end of the pipe having the smallest cross-sectional area has a cross-sectional area slightly larger than a cross-sectional area of the filament.

In another preferred embodiment, the pipe is composed of metal having a high melting point and a low vapor pressure. Thus, it is preferable to compose the pipe of tungsten (W), tantalum (Ta), or rhenium (Re).

In still another preferred embodiment, the pipe is electrically isolated from any peripherals by being carried with a ring which is composed of electrically insulative material. Such electrically insulative material includes, for instance, pyrolyric boron nitride (PBN), aluminum nitride, and aluminum oxide. An insulative material may be applied to an internal surface of the pipe for electrical insulation.

The invention further includes a cover for use with an apparatus for producing hydrogen radicals, which entirely surrounds the apparatus. The cover has only one opening through which hydrogen radicals, produced by the apparatus, are irradiated toward an object, and is composed of material which does not produce hydride through reacting with the hydrogen radical.

In a preferred embodiment, the cover is composed of one of tungsten (W), tantalum (Ta), rhenium (Re) and pyrolyric boron nitride (PBN).

The advantages achieved by the aforementioned present invention will be described below.

In the hydrogen radical producing apparatus in accordance with the invention, hydrogen gas, as raw material, is compelled to gather around the filament by the pipe, which is preferably conical in shape. Accordingly, the probability of contact between atomic hydrogen and the filament is increased thereby enhancing the production rate of hydrogen radicals. In addition, since there is no shield between the filament and a substrate, there is only a low probability that the hydrogen radicals produced will react with other elements before reaching the substrate. If the filament deforms over time, the pipe may come into contact with the smaller cross-sectional end of the pipe. However, the electrical current running through the filament is prevented from leaking to the pipe by keeping the pipe in electrically insulated from it's environment. The contact of the pipe with the filament may raise a temperature of the pipe; however, there is no fear of gas leakage because the pipe is composed of a metal having a high melting point and, hence, also having a quite small vapor pressure. Even if a temperature of the portion of the pipe in contact with the filament is locally raised to nearly the temperature of the filament, generation of hydrogen radicals would still occur at that portion, resulting in enhancement of the production rate of the hydrogen radicals.

The cover in accordance with the invention is to be used for a hydrogen radical producing apparatus, and prevents gas leakages in such an apparatus. The cover completely surrounds the high temperature sections of the hydrogen radical producing apparatus, except an opening which is directed toward a substrate. Thus, the irradiation of hydrogen radicals from the filament is stopped by the cover, except for the irradiation directed toward the substrate. The resulting that gas leakage from the hydrogen radical producing apparatus are prevented.

The cover also interrupts the irradiation of hydrogen radicals except for that occurring in a direction toward the substrate, and thereby it is possible to decrease the reaction of hydrogen radicals with material stuck to an internal surface of the hydrogen radical producing apparatus. The hydrogen radicals to be irradiated but interrupted by the cover either stick to the internal surface of the cover or return to hydrogen molecules, which are less active and are released again. It should be noted that the cover has to be composed of material which does not produce hydride by reacting with hydrogen radicals. The cover is thus preferably composed of tungsten (W), tantalum (Ta), rhenium (Re) or pyrolyric boron nitride (PBN).

The cover, in accordance with the invention, may be used for with a conventional hydrogen radical producing apparatus.

As has been explained, the hydrogen radical producing apparatus in accordance with the invention provides a high production rate of hydrogen radicals, and also prevents gas leakage therefrom to thereby avoid contamination due to leaked gases, since hot temperature sections of the apparatus are composed only of metal having a high melting point.

The cover in accordance with the invention, also reduces the likelihood of contamination caused by impurities such as leaked gas and hydride, even if the cover is used with a hydrogen radical producing apparatus using material which has a high vapor pressure or which is prone to produce hydride.

The above and other objects and advantageous features of the present invention will become apparent from the following description made with reference to the accompanying drawings, in which like reference characters designate the same or similar parts throughout the drawings.

DESCRIPTION OF THE PREFERRED EMBODIMENTS

The preferred embodiments in accordance with the present invention will be explained hereinbelow with reference to drawings.

Figure 3:
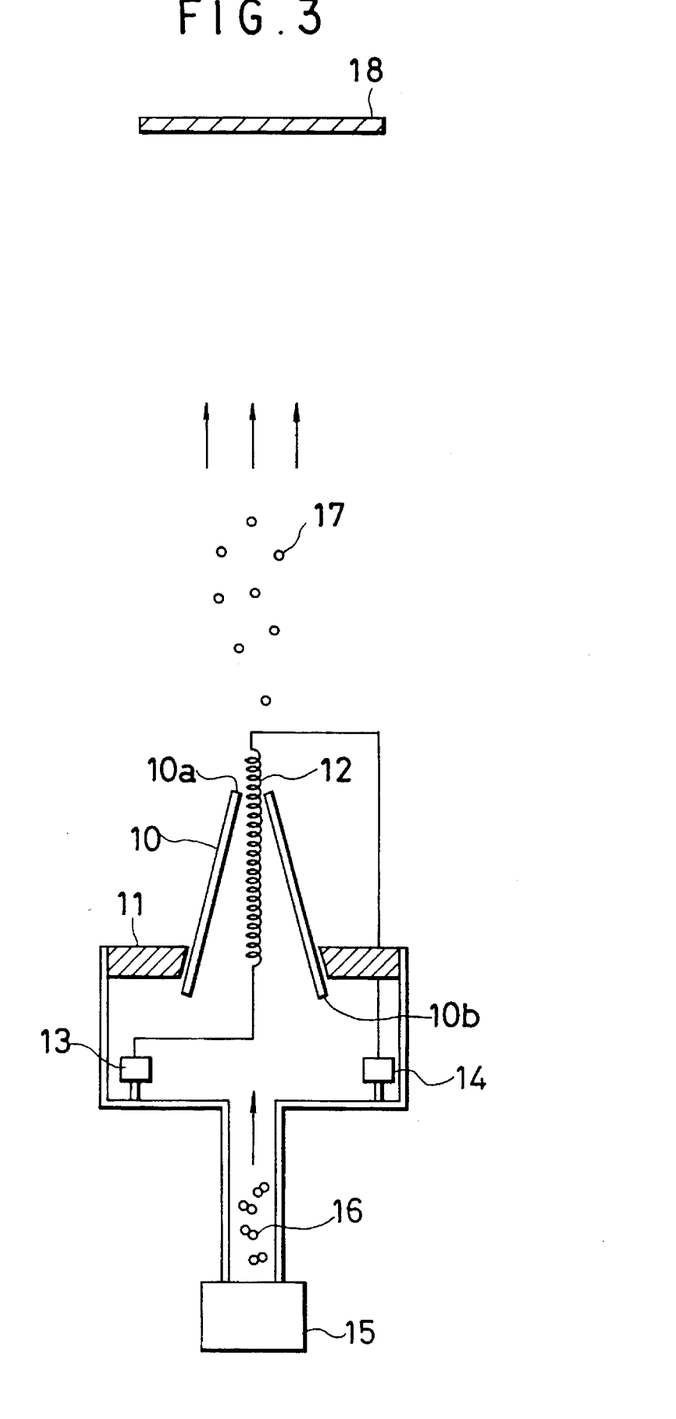
FIG. 3 illustrates a first embodiment of the hydrogen radical producing apparatus in accordance with the invention.

FIG. 3 illustrates a first embodiment of a hydrogen radical apparatus in accordance with the invention. The apparatus includes a conically shaped pipe 10 composed of tungsten (W). Conical pipe 10 is inserted into a ring 11 so that pipe 10 is carried in position with the ring 11. Ring 11 is composed of pyrolytic boron nitride (PBN), which is electrically insulative, and hence conical pipe 10 is electrically insulated from a later-mentioned filament 12 and also from other components.

In conical pipe 10 is disposed a coil-shaped filament 12, which generates heat when an electrical current runs therethrough. A coil of filament 12 is 2 mm in diameter, and a smaller diameter end 10a of conical pipe 10 is 5 mm in diameter. Thus, filament 12 is located quite close to the smaller diameter end 10a of pipe 10, but is not in contact with pipe 10. Filament 12 is connected, at opposite ends thereof, with a positive terminal 13 and a negative terminal 14 so that an electrical current runs through filament 12 from positive terminal 13 to negative terminal 14.

A hydrogen gas source 15 supplies hydrogen gas 16 to conical pipe 10 through a larger diameter end 10b of pipe 10. Since pipe 10 has a decreasing cross-sectional area from the larger diameter end 10b toward the smaller diameter end 10a, the hydrogen gas 16 introduced into pipe 10 is gathered around filament 12 while moving to the smaller diameter end 10a. Thus, hydrogen gas 16 contacts heated filament 12, and thereby hydrogen gas 16 is dissociated into hydrogen radicals 17. The hydrogen radicals 17 thus produced are irradiated to a silicon substrate 18.

Figure 4A:
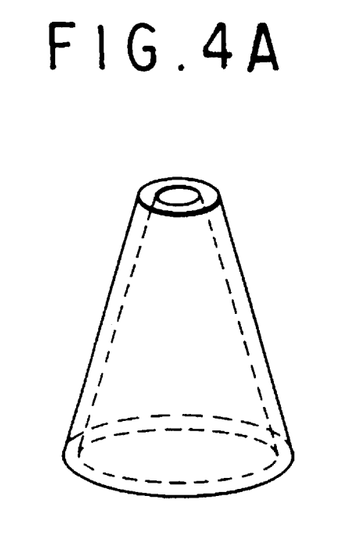
FIGS. 4A, 4B, 4C and 4D are perspective views of a pipe used as a component of the apparatus.
Figure 4B:
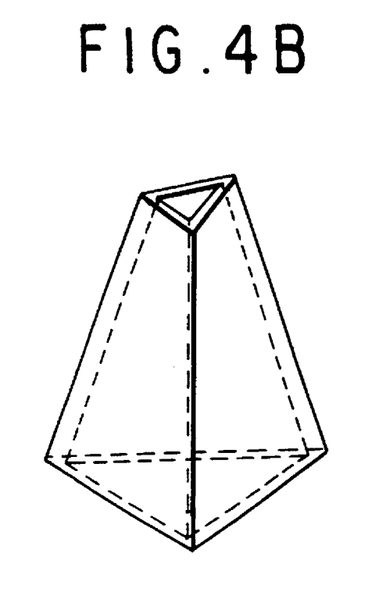
Figure 4C:
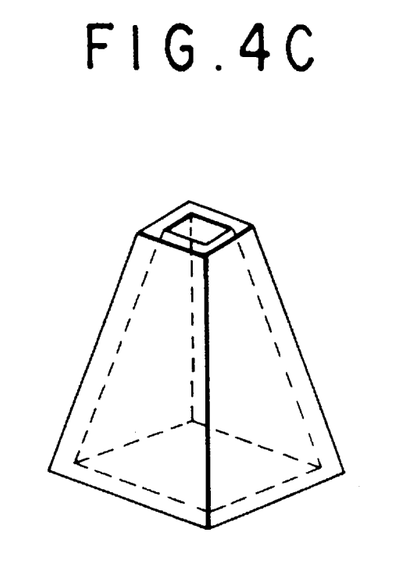
Figure 4D:
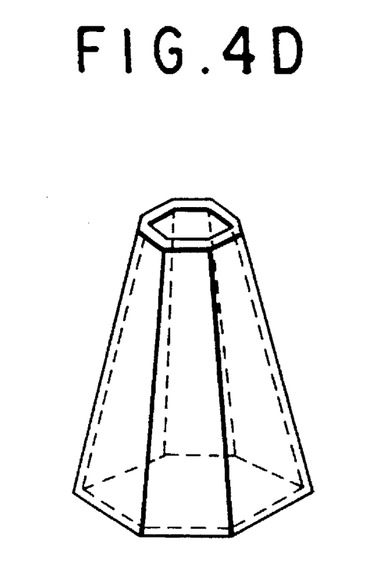

In this embodiment, pipe 10 is conical in shape, as illustrated in FIG. 4A. However, it should be noted that pipe 10 may have any shape so long as pipe 10 has a decreasing or increasing cross-sectional area from one end toward the other thereof. Thus, the pipe may be shaped in a triangular pyramid (as illustrated in FIG. 4B), a quadrangular pyramid (as illustrated in FIG. 4C), or any other pyramid having a polygonal cross-section (as illustrated in FIG. 4D).

An experiment was carried out, in which hydrogen radicals were irradiated to a Si (001) substrate in a molecular beam epitaxy (MBE) device, using the hydrogen radical producing apparatus in accordance with the first embodiment. Patterns having a diploid structure were observed when a cleaned surface of the Si (001) substrate was observed in a <110> direction by means of reflection high-energy electron diffraction (RHEED). When hydrogen radicals were irradiated to the silicon substrate, dangling bonds at a surface of the Si substrate were terminated by hydrogen, and thereby the RHEED patterns were changed to a monoploid structure. Such a change could not be observed in the when only hydrogen molecules were irradiated to the silicon substrate.

In the experiment, the temperature of the substrate was set to be equal to a room temperature, and an amount of hydrogen irradiation was set so that a back-pressure, measured when exhausted with a cryopump, was $1 \times 10^{-6}$ Torr. The irradiation of hydrogen radicals caused the RHEED patterns to change from a diploid structure to a monoploid structure within a few seconds of commencing the irradiation, and thereby a high production rate of hydrogen radicals was recognized.

Figure 5:
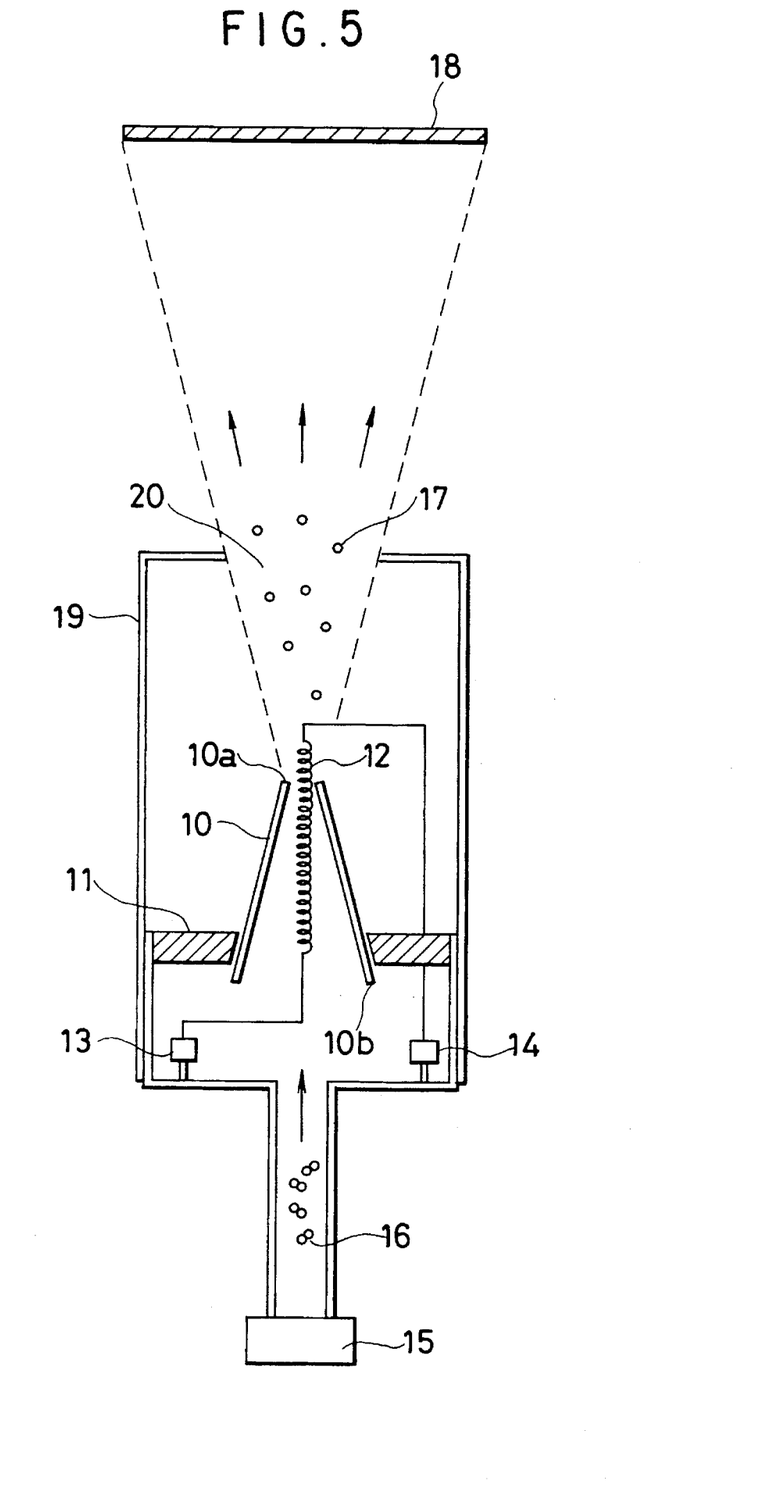
FIG. 5 illustrates a second embodiment of the hydrogen radical producing apparatus in accordance with the invention.

FIG. 5 illustrates a second embodiment of a hydrogen radical producing apparatus in accordance with the invention. In FIG. 5, parts that correspond to those illustrated in FIG. 3 have been provided with the same reference numerals, and thus detailed explanation will be omitted.

The apparatus in accordance with the second embodiment, includes a cover 19 which entirely surrounds a high temperature section, that is, filament 12, and which also surrounds ring 11 and filament 12. Cover 19 is composed of tungsten (W), which does not produce hydride by reacting with hydrogen radicals. Cover 19 has only one opening 20 at a top surface thereof. Opening 20 faces substrate 18 so that both the produced hydrogen radicals 17 and the irradiation from filament 12 are emitted through the opening 20 and directed only to substrate 18.

An experiment was carried out, in which hydrogen radicals were irradiated to a Si (001) substrate with a molecular beam epitaxy (MBE) device having an internal surface coated with Te, Hg and Cd. The amount of hydrogen irradiation was set so that the back pressure measured when exhausted with a cryopump was $1 \times 10^{-6}$ Torr.

A silicon substrate coated with a protective oxide film (having a thickness of 10 angstroms) was first placed in a reaction chamber, and then the silicon substrate was kept at 700 degrees centigrade. Then, a surface of the silicon substrate was cleaned by irradiating hydrogen radicals to the silicon substrate to thereby remove the protective oxide film. Then, the hydrogen radical irradiation was finished, and the temperature of the substrate was lowered to room temperature. Then, an analysis was carried out as to impurities existing at the surface of the silicon substrate by means of X-ray photo-electron spectroscopy (XPS).

Figure 6:
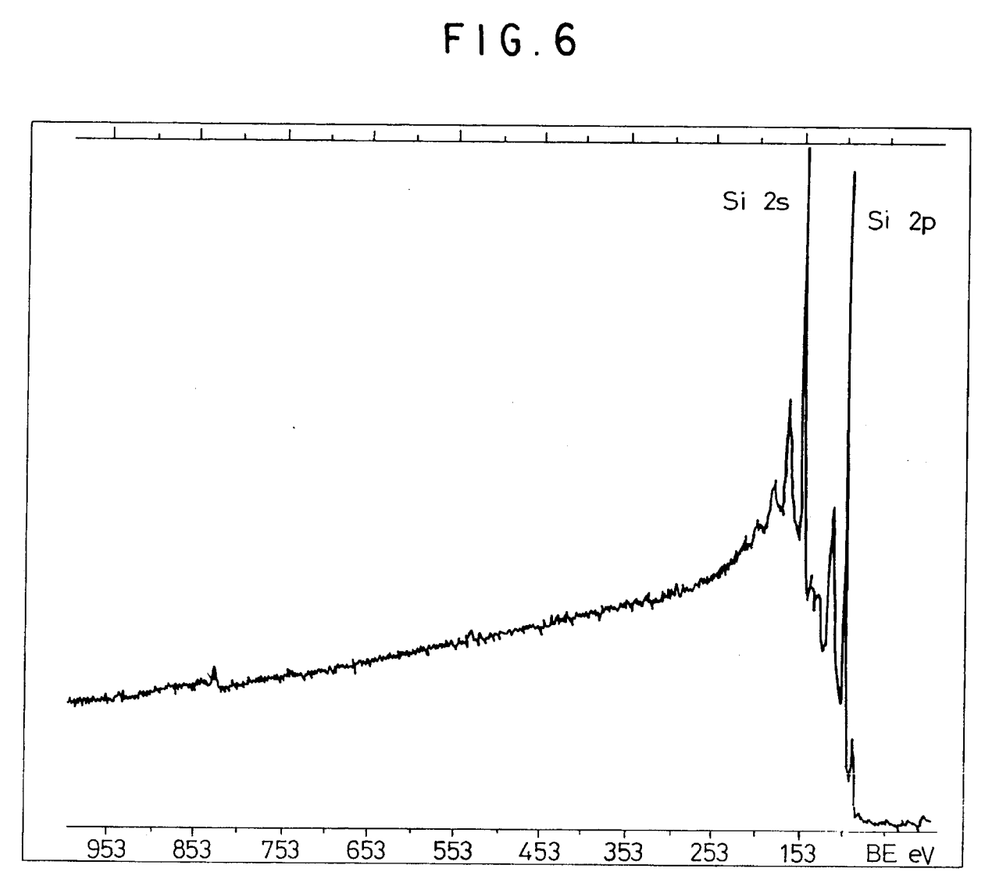
FIG. 6 shows the XPS spectrum of the surface of a silicon substrate wherein the cover in accordance with the invention was used.

The results of the experiment were that Te was detected at the surface of the silicon substrate when cover 19 was not used (as shown in FIG. 2), while no elements other than Si were detected when cover 19 was used (as shown in FIG. 6). These results prove the advantageous effects obtained by cover 19.

While the present invention has been described in connection with certain preferred embodiments, it is to be understood that the subject matter encompassed by way of the present invention is not limited to those specific embodiments. On the contrary, it is intended that the subject matter of the invention include all alternatives, modifications, and equivalents as can be included within the spirit and scope of the following claims.

What is claimed is:

1. An apparatus for producing hydrogen radical, comprising:

a pipe for concentrating hydrogen gas to the surface of a filament;

said filament generating heat by running an electrical current therethrough, said filament being longitudinally aligned with and at least partially disposed in said pipe;

walls of said pipe sloping inwardly, in a direction of hydrogen gas flow, over a substantial portion of an overall length of said filament;

a hydrogen gas source for supplying said hydrogen gas to said pipe;

said pipe being electrically isolated from other parts of said apparatus, including said filament.

2. The apparatus as recited in claim 1, wherein said pipe is conical in shape.

3. The apparatus as recited in claim 1, wherein said pipe is composed of metal having a higher melting point than the temperature of said filament and a sufficiently low vapor pressure to prevent leakage there through of hydrogen.

4. The apparatus as recited in claim 3, wherein said metal is one of tungsten (W), tantalum (Ta) and rhenium (Re).

5. The apparatus as recited in claim 1, wherein said pipe is held in place by a ring composed of electrically insulative material.

6. The apparatus as recited in claim 5, wherein said electrically insulative material is one of pyrolyric boron nitride, aluminum nitride and aluminum oxide.

7. An apparatus for producing hydrogen radical, comprising:

a pipe for concentrating hydrogen gas to the surface of a filament;

said filament generating heat by running an electrical current therethrough, said filament being longitudinally aligned with and at least partially disposed in said pipe;

walls of said pipe sloping inwardly, in a direction of hydrogen gas flow, over a substantial portion of an overall length of said filament;

a hydrogen gas source for supplying said hydrogen gas to said pipe;

said pipe being electrically isolated from other parts of said apparatus, including said filament.

a cover for entirely surrounding said filament and said pipe, said cover having an opening through which hydrogen radicals are to be irradiated, said cover being composed of material which does not produce hydride by reacting with hydrogen radical;

whereby said hydrogen radical is produced by a contact between said hydrogen gas and said filament.

8. The apparatus as recited in claim 7, wherein said pipe is conical in shape.

9. The apparatus as recited in claim 7, wherein said pipe is composed of metal having a higher melting point than the temperature of said filament and a sufficiently low vapor pressure to prevent leakage there through of hydrogen.

10. The apparatus as recited in claim 9, wherein said metal is one of tungsten (W), tantalum (Ta) and rhenium (Re).

11. The apparatus as recited in claim 7, wherein said pipe is held in place by a ring composed of electrically insulative material.

12. The apparatus as recited in claim 11, wherein said electrically insulative material is one of pyrolyric boron nitride, aluminum nitride and aluminum oxide.

13. The apparatus as recited in claim 7, wherein said cover is composed of one of tungsten (W), tantalum (Ta), rhenium (Re) and pyrolytic boron nitride (PBN).

14. An apparatus for producing hydrogen radical, comprising:

a pipe for conveying hydrogen gas from a first pipe end thereof to and through a second pipe end thereof, walls of said pipe sloping inwardly in the direction from said first pipe end to said second pipe end, said walls sloping inwardly over a substantial portion of the overall length of a filament, said filament being longitudinally aligned with said pipe, said filament having a first filament end within said pipe and a second filament end extending at least to said second pipe end, and a source of said hydrogen gas positioned in proximity to said first pipe end;

whereby said inwardly sloping pipe directs said hydrogen gas to contact said filament to produce said hydrogen radical.

15. The apparatus as set forth in claim 14, further comprising:

an electrically insulative ring disposed around a portion of said pipe, and a cover having only one opening for emitting said hydrogen radical, said opening of said cover being axially spaced from and coaxial with said pipe;

wherein said filament, said pipe, and said ring are disposed within said cover.

16. The apparatus as set forth in claim 15, wherein:

said pipe is composed of one of tungsten, tantalum, and rhenium;

said ring is composed of one of pyrolytic boron nitride, aluminum nitride, and aluminum oxide; and said cover is composed of one of tungsten, tantalum, rhenium, and pyrolytic boron nitride.

* * * * *